United States Patent
Kjorling et al.

(10) Patent No.: US 7,590,543 B2
(45) Date of Patent: *Sep. 15, 2009

(54) METHOD FOR REDUCTION OF ALIASING INTRODUCED BY SPECTRAL ENVELOPE ADJUSTMENT IN REAL-VALUED FILTERBANKS

(75) Inventors: Kristofer Kjorling, Solna (SE); Lars Villemoes, Jaerfaella (SE)

(73) Assignee: Coding Technologies Sweden AB, Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 11/859,521

(22) Filed: Sep. 21, 2007

(65) Prior Publication Data

US 2008/0010061 A1    Jan. 10, 2008

Related U.S. Application Data

(62) Division of application No. 10/652,397, filed on Aug. 29, 2003.

(30) Foreign Application Priority Data

Sep. 18, 2002  (SE)  ................................. 0202770

(51) Int. Cl.
*G10L 19/00* (2006.01)
*H04B 15/00* (2006.01)

(52) U.S. Cl. ............... 704/500; 704/201; 704/200.1; 704/229; 370/240

(58) Field of Classification Search ............. 704/201, 704/500, 229, 200.1; 370/240; 381/23
See application file for complete search history.

(56) References Cited

U.S. PATENT DOCUMENTS

| 5,732,189 | A | | 3/1998 | Johnston et al. |
| 5,890,125 | A | * | 3/1999 | Davis et al. ................. 704/501 |
| 6,124,895 | A | | 9/2000 | Fielder |
| 6,236,731 | B1 | * | 5/2001 | Brennan et al. ............. 381/316 |
| 6,363,338 | B1 | | 3/2002 | Ubale et al. |
| 6,718,300 | B1 | * | 4/2004 | Schuller ..................... 704/226 |

(Continued)

FOREIGN PATENT DOCUMENTS

| WO | WO 98/57436 A2 | 12/1998 |
| WO | WO 02/080362 | 3/2002 |

OTHER PUBLICATIONS

T. A. Ramstad and J. P. Tanem, "Cosine-modulated analysis-synthesis filter bank with critical sampling and perfect reconstruction," In Proc. IEEE Int. Conf. ASSP (Toronto), May 1991, pp. 1789-1792*

(Continued)

*Primary Examiner*—Richemond Dorvil
*Assistant Examiner*—Greg A Borsetti
(74) *Attorney, Agent, or Firm*—Michael A. Glenn; Glenn Patent Group

(57) ABSTRACT

The present invention proposes a new method for improving the performance of a real-valued filterbank based spectral envelope adjuster. By adaptively locking the gain values for adjacent channels dependent on the sign of the channels, as defined in the application, reduced aliasing is achieved. Furthermore, the grouping of the channels during gain-calculation, gives an improved energy estimate of the real valued subband signals in the filterbank.

22 Claims, 7 Drawing Sheets

U.S. PATENT DOCUMENTS

| | | | |
|---|---|---|---|
| 7,069,212 B2* | 6/2006 | Tanaka et al. | 704/225 |
| 7,197,093 B2* | 3/2007 | Koyata | 375/340 |
| 2002/0015503 A1* | 2/2002 | Hou | 381/94.3 |
| 2003/0016772 A1 | 1/2003 | Ekstrand | |
| 2003/0108214 A1 | 6/2003 | Brennan et al. | |
| 2004/0042557 A1* | 3/2004 | Kabel et al. | 375/260 |

OTHER PUBLICATIONS

P. Ekstrand, "Bandwidth extension of audio signals by spectral band replication," in Proc. 1st IEEE Benelux Workshop on Model based Processing and Coding of Audio (MPCA-2002), Leuven, Belgium, Nov. 2002, pp. 53-58.*

S. Weiss, L. Lampe, and R. W. Stewart, "Efficient implementations of complex and real valued filter banks for comparative subband processing with an application to adaptive filtering," Proc. Int. Symp. Communication Systems \& Digital Signal Processing Sheffield, U.K., vol. 1, Apr. 1998.*

N. Gilchrist, et al. "Collected Papers on Digital Audio Bit-Rate Reduction". Audio-Engineering Society. No. 3. 1996.

* cited by examiner

METHOD FOR REDUCTION OF ALIASING INTRODUCED BY SPECTRAL ENVELOPE ADJUSTMENT IN REAL-VALUED FILTERBANKS

CROSS-REFERENCE TO RELATED APPLICATIONS

This application is a divisional of U.S. Ser. No. 10/652,397 filed 29 Aug. 2003.

TECHNICAL FIELD

The present invention relates to systems comprising spectral envelope adjustment of audio signals using a real-valued subband filterbank. It reduces the aliasing introduced when using a real-valued subband filterbank for spectral envelope adjustment. It also enables an accurate energy calculation for sinusoidal components in a real-valued subband filterbank.

BACKGROUND OF THE INVENTION

It has been shown in PCT/SE02/00626 "Aliasing reduction using complex exponential modulated filterbanks", that a complex-exponential modulated filterbank is an excellent tool for spectral envelope adjustment audio signals. In such a procedure the spectral envelope of the signal is represented by energy-values corresponding to certain filterbank channels. By estimating the current energy in those channels, the corresponding subband samples can be modified to have the desired energy, and hence the spectral envelope is adjusted. If restraints on computational complexity prevents the usage of a complex exponential modulated filterbank, and only allows for a cosine modulated (real-valued) implementation, severe aliasing is obtained when the filterbank is used for spectral envelope adjustment. This is particularly obvious for audio signals with a strong tonal structure, where the aliasing components will cause intermodulation with the original spectral components. The present invention offers a solution to this by putting restraints on the gain-values as a function of frequency in a signal dependent manner.

SUMMARY OF THE INVENTION

It is the object of the present invention to provide an improved technique for spectral envelope adjustment.

In accordance with a first aspect of the invention, this object is achieved by an apparatus for spectral envelope adjustment of a signal, comprising: means for providing a plurality of subband signals, a subband signal having associated therewith a channel number k indicating a frequency range covered by the subband signal, the subband signal originating from a channel filter having the channel number k in an analysis filterbank having a plurality of channel filters, wherein the channel filter having the channel number k has a channel response which is overlapped with a channel response of an adjacent channel filter having a channel number k−1 in an overlapping range; means for examining the subband signal having associated therewith the channel number k and for examining an adjacent subband signal having associated therewith the channel number k−1 to determine, whether the subband signal and the adjacent subband signal have aliasing generating signal components in the overlapping range; means for calculating a first gain adjustment value and a second gain adjustment value for the subband signal and the adjacent subband signal in response to a positive result of the means for examining, wherein the means for calculating is operative to determine the first gain adjustment value and the second gain adjustment value dependent on each other; and means for gain adjusting the subband signal and the adjacent subband signal using the first and the second gain adjusting values or for outputting the first and the second gain adjustment values for transmission or storing.

In accordance with a second aspect of the invention, this object is achieved by a method of spectral envelope adjustment of a signal, comprising: providing a plurality of subband signals, a subband signal having associated therewith a channel number k indicating the frequency range covered by the subband signal, the subband signal originating from a channel filter having the channel number k in an analysis filterbank having a plurality of channel filters, wherein the channel filter having the channel number k has a channel response which is overlapped with a channel response of an adjacent channel filter having a channel number k−1 in an overlapping range; examining the subband signal having associated therewith the channel number k and for examining an adjacent subband signal having associated therewith the channel number k−1 to determine, whether the subband signal and the adjacent subband signal have aliasing generating signal components in the overlapping range; calculating a first gain adjustment value and a second gain adjustment value for the subband signal and the adjacent subband signal in response to a positive result of the means for examining, wherein the means for calculating is operative to determine the first gain adjustment value and the second gain adjustment value dependent on each other; and gain adjusting the subband signal and the adjacent subband signal using the first and the second gain adjusting values or outputting the first and the second gain adjustment values for transmission or storing.

In accordance with a third aspect of the invention, this object is achieved by a computer program having a program code for performing the above method, when the computer program runs on a computer.

In accordance with a fourth aspect of the invention, this object is achieved by a method for spectral envelope adjustment of a signal, using a filterbank where the filterbank comprises a real valued analysis part and a real valued synthesis part or where said filterbank comprises a complex analysis part and a real valued synthesis part, where a lower, in frequency, channel and an adjacent higher, in frequency, channel are modified using the same gain value, if the lower channel has a positive sign and the higher channel has a negative sign, so that a relation between subband samples of the lower channel and subband samples of the higher channel is maintained.

The present invention relates to the problem of intermodulation introduced by aliasing in a real-valued filterbank used for spectral envelope adjustment. The present invention analyses the input signal and uses the obtained information to restrain the envelope adjustment capabilities of the filterbank by grouping gain-values of adjacent channel in an order determined by the spectral characteristic of the signal at a given time. For a real-valued filterbank e.g. a pseudo-Quadrature Mirror Filter QMF) where transition bands overlap with closest neighbour only, it can be shown that due to aliasing cancellation properties the aliasing is kept below the stop-band level of the prototype filter. If the prototype filter is designed with a sufficient aliasing suppression the filterbank is of perfect reconstruction type from a perceptual point of view, although this is not the case in a strict mathematical sense. However, if the channel gain of adjacent channels are altered between analysis and synthesis, the aliasing cancellation properties are violated, and aliasing components will appear audible in the output signal. By performing a low-order linear prediction on the subband samples of the filterbank channels, it is possible to asses, by observing the properties of the LPC polynomial, where in a filterbank channel a strong tonal component is present. Hence it is possible to assess which adjacent channels that must not have independent gain-values in order to avoid a strong aliasing component from the tonal component present in the channel.

The present invention comprises the following features:

Analysing means of the subband channels to assess where in a subband channel a strong tonal component is present;

Analysing by means of a low-order linear predictor in every subband channel;

Gain grouping decision based on the location of the zeros of the LPC polynomial;

Accurate energy calculation for a real-valued implementation.

BRIEF DESCRIPTION OF THE DRAWINGS

The present invention will now be described by way of illustrative examples, not limiting the scope or spirit of the invention, with reference to the accompanying drawings, in which.

DESCRIPTION OF PREFERRED EMBODIMENTS

The below-described embodiments are merely illustrative for the principles of the present invention for improvement of a spectral envelope adjuster based on a real-valued filterbank. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Figure 1:
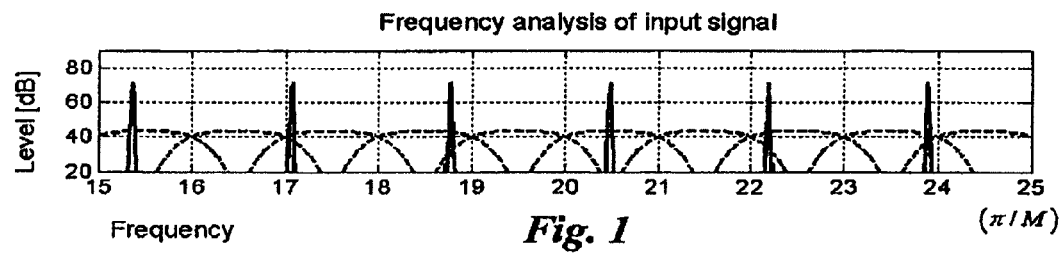
FIG. 1 illustrates a frequency analysis of the frequency range covered by channel 15 to 24 of an M channel subband filterbank, of an original signal containing multiple sinusoidal components. The frequency resolution of the displayed analysis is intentionally higher than the frequency resolution of the used filterbanks in order to display where in a filterbank channel the sinusoidal is present.

In the following description a real-valued pseudo-QMF is used comprising a real-valued analysis as well as a real valued synthesis. It should be understood however, that the aliasing problem addressed by the present invention also appears for systems with a complex analysis and a real-valued synthesis, as well as any other cosine-modulated filterbank apart from the pseudo-QMF used in this description. The present invention is applicable for such systems as well. In a pseudo-QMF every channel essentially only overlaps its adjacent neighbour in frequency. The frequency-response of the channels is shown in the subsequent figures by the dashed lines. This is only for illustrative purposes to indicate the overlapping of the channels, and should not be interpreted as the actual channel response given by the prototype filter. In FIG. 1 the frequency analysis of an original signal is displayed. The figure only displays the frequency range covered by $15 \cdot \pi/M$ to $25 \cdot \pi/M$ of the M channel filterbank. In the following description the designated channel numbers are derived from their low crossover frequency, hence channel 16 covers the frequency range $16 \cdot \pi/M$ to $17 \cdot \pi/M$ excluded the overlap with its neighbours. If no modification is done to the subband samples between analysis and synthesis the aliasing will be limited by the properties of the prototype filter. If the subband samples for adjacent channels are modified according to a gain vector, as displayed in FIG. 2, with independent gain values for every channel the aliasing cancellation properties are lost. Hence an aliasing component will show up in the output signal mirrored around the cross-over region of the filterbank channels, as displayed in FIG. 3. This is not true for an complex implementation as outlined in PCT/SE02/00626 where the output, as displayed in FIG. 4, would not suffer from disturbing aliasing components. In order to avoid the aliasing components that causes severe intermodulation distortion in the output, the present invention teaches that two adjacent channels that share a sinusoidal component as e.g. channel 18 and 19 in FIG. 1, must be modified similarly, i.e. the gain factor applied to the two channels must be identical. This is hereafter referred to as a coupled gain for these channels. This of course implies that the frequency resolution of the envelope adjuster is sacrificed, in order to reduce the aliasing. However, given a sufficient number of channels, the loss in frequency resolution is a small price to pay for the absence of severe intermodulation distortion.

In order to assess which channels should have coupled gain-factors, the present invention teaches the usage of in-band linear prediction. If a low order linear prediction is used, e.g. a second order LPC, this frequency analysis tool is able to resolve one sinusoidal component in every channel. By observing the sign of the first predictor polynomial coefficient it is easy to determine if the sinusoidal component is situated in the upper or lower half of the frequency range of the subband channel.

Figure 3:
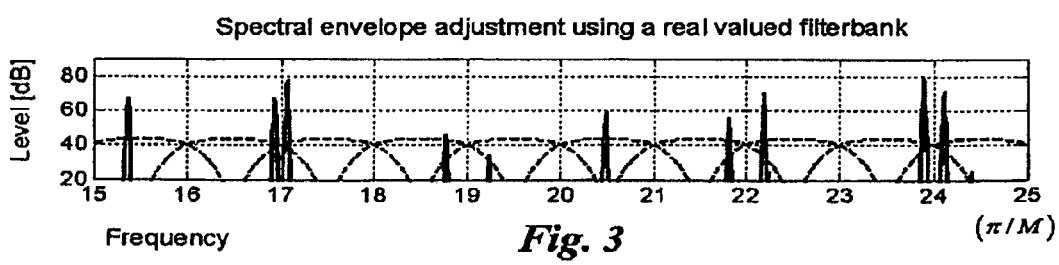
FIG. 3 illustrates the output from the above gain adjustment in a real-valued implementation without the present invention.
Figure 4:
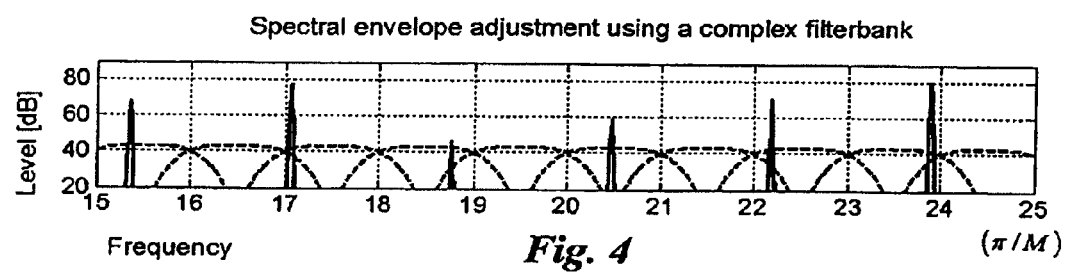
FIG. 4 illustrates the output from the above gain adjustment in a complex-valued implementation.
Figure 5:
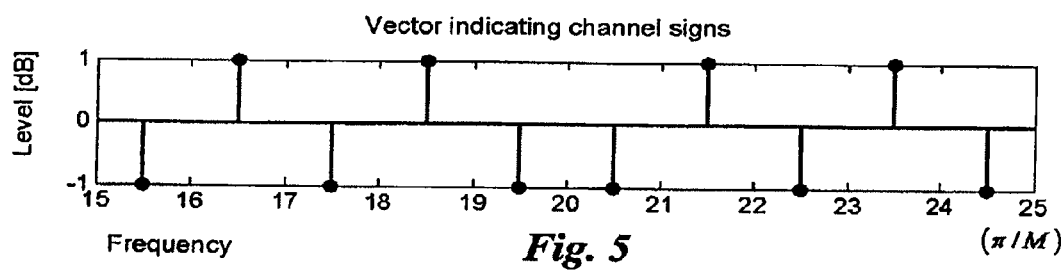
FIG. 5 illustrates in which half of every channel a sinusoidal component is present.
Figure 7:
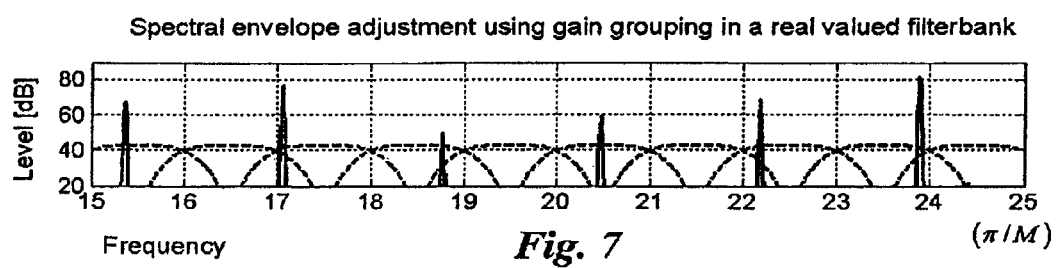
FIG. 7 illustrates the output from the above gain adjustment in a real-valued implementation with the present invention.

A second order prediction polynomial $$A(z)=1-\alpha_1 z^{-1}-\alpha_2 z^{-2} \qquad (1)$$

is obtained by linear prediction using the autocorrelation method or the covariance method for every channel in the QMF filterbank that will be affected by the spectral envelope adjustment. The sign of the QMF-bank channel is defined according to:

$$\text{sign}(k) = \begin{cases} (-1)^k & \text{if } a_1 < 0 \\ (-1)^{k+1} & \text{if } a_1 \geq 0 \end{cases}, 0 < k < M, \quad (2)$$

where k is the channel number, M is the number of channels, and where the frequency inversion of every other QMF channel is taken into account. Hence, it is possible for every channel to assess where a strong tonal component is situated, and thus grouping the channels together that share a strong sinusoidal component. In FIG. 5 the sign of each channel is indicated and hence in which half of the subband channel the sinusoidal is situated, where +1 indicates the upper half and −1 indicates the lower half. The invention teaches that in order to avoid the aliasing components the subband channel gain factors should be grouped for the channels where channel k has a negative sign and channel k−1 has a positive sign. Accordingly the channel signs as illustrated by FIG. 5 gives the required grouping according to FIG. 6, where channel 16 and 17 are grouped, 18 and 19 are grouped, 21 and 22 are grouped, and channel 23 and 24 are grouped. This means that the gain values $g_k(m)$ for the grouped channels k and k−1 are calculated together, rather than separately, according to:

$$g_k(m) = g_{k-1}(m) = \sqrt{\frac{E_k^{ref}(m) + E_{k-1}^{ref}(m)}{E_k(m) + E_{k-1}(m)}}, \quad (3)$$

where $E_k^{ref}(m)$ is the reference energy, and $E_k(m)$ is the estimated energy, at the point m in time. This ensures that the grouped channels get the same gain value. Such grouping of the gain factors preserves the aliasing cancellation properties of the filterbank and gives the output according to FIG. 7. Here it is obvious that the aliasing components present in FIG. 3, are vanished. If there is no strong sinusoidal component, the zeros will nevertheless be situated in either half of the z-plane, indicated by the sign of the channel, and the channels will be grouped accordingly. This means that there is no need for detection based decision making whether there is a strong tonal component present or not.

In a real-valued filterbank, the energy estimation is not straightforward as in a complex representation. If the energy is calculated by summing the squared subband samples of a single channel, there is a risk of tracking the time envelope of the signal rather than the actual energy. This is due to the fact that a sinusoidal component can have an arbitrary frequency from 0 to the filterbank channel width. If a sinusoidal component is present in a filterbank channel it can have a very low relative frequency, albeit being a high frequency sinusoidal in the original signal. Assessing the energy of this signal becomes difficult in a real-valued system since, if the averaging time is badly chosen with respect to the frequency of the sinusoidal, a tremolo (amplitude-variation) can be introduced, when in fact the signal energy actually is constant.

The present invention teaches however, that the filterbank channels should be grouped two-by-two given the location of the sinusoidal components. This significantly reduces the tremolo-problem, as will be outlined below.

In a cosine-modulated filterbank the analysis filters $h_k(n)$ are cosine-modulated versions of a symmetric low-pass prototype filter $p_0(n)$ as $$h_k(n) = \sqrt{\frac{2}{M}} p_0(n) \cos\left\{\frac{\pi}{2M}(2k+1)\left(n - \frac{N}{2} - \frac{M}{2}\right)\right\} \quad (4)$$

where M is the number of channels, k=0, 1, . . . , M−1, N is the prototype filter order and n=0, 1, . . . , N. The symmetry of the prototype filter is assumed here to be with respect to n=N/2. The derivations below are similar in case of half sample symmetry.

Given a sinusoidal input signal $x(n) = A \cos(\Omega n + \theta)$ with frequency $0 \leq \Omega \leq \pi$, the subband signal of channel $k \geq 1$ can be computed to be approximately $$v_k(n) \approx \frac{A}{\sqrt{2M}} P\left\{\Omega - \frac{\pi}{2M}(2k+1)\right\} \quad (5)$$
$$\cos\left\{\Omega Mn + \frac{\pi}{4}(2k+1) - \frac{N\Omega}{2} + \theta\right\},$$

where $P(\omega)$ is the real valued discrete time Fourier transform of the shifted prototype filter $p_0(n+N/2)$. The approximation is good when $P(\Omega+\pi(k+1/2)/M)$ is small, and this holds in particular if $P(\omega)$ is negligible for $|\omega| \geq \pi/M$, a hypothesis underlying the discussion which follows. For spectral envelope adjustment, the averaged energy within a subband k might be calculated as $$E_k(m) = \sum_{n=0}^{L-1} v_k(mL+n)^2 w(n), \quad (6)$$

where w(n) is a window of length L. Inserting equation (5) in equation (6) leads to $$E_k(m) = \frac{A^2}{4M} P\left\{\Omega - \frac{\pi}{2M}(2k+1)\right\}^2 \quad (7)$$
$$\left\{W(0) + |W(2\Omega M)|\cos\left(2\Omega MLm + \frac{\pi}{2}(2k+1) + \Psi(\Omega)\right)\right\},$$

where $\Psi(\Omega)$ is a phase term which is independent of k and $W(\omega)$ is the discrete time Fourier transform of the window. This energy can be highly fluctuating if $\Omega$ is close to an integer multiple of $\pi/M$, although the input signal is a stationary sinusoid. Artifacts of tremolo type will appear in a system based on such single real analysis bank channel energy estimates.

On the other hand, assuming that $\pi(k-1/2)/M \leq \Omega \leq \pi(k+1/2)/M$ and that $P(\omega)$ is negligible for $|\omega| \geq \pi/M$, only the subband channels k and k−1 have nonzero outputs, and these channels will be grouped together as proposed by the present invention. The energy estimate based on these two channels is $$E_k(m) + E_{k-1}(m) = \frac{A^2}{4M} S_k(\Omega)\left\{W(0) + \varepsilon_k(\Omega)\cos\left(2\Omega MLm + \frac{\pi}{2}(2k+1) + \Psi(\Omega)\right)\right\}, \quad (8)$$

-continued $$S_k(\Omega) = P\left\{\Omega - \frac{\pi}{2M}(2k+1)\right\}^2 + P\left\{\Omega - \frac{\pi}{2M}(2k-1)\right\}^2 \quad (9)$$

and $$\varepsilon_k(\Omega) = |W(2\Omega M)| \quad (10)$$

$$\frac{P\left\{\Omega - \frac{\pi}{2M}(2k+1)\right\}^2 - P\left\{\Omega - \frac{\pi}{2M}(2k-1)\right\}^2}{S_k(\Omega)}.$$

For most useful designs of prototype filters, it holds that $S(\Omega)$ is approximately constant in the frequency range given above. Furthermore, if the window w(n) has a low-pass filter character, then $|\varepsilon(\Omega)|$ is much smaller than $|W(0)|$, so the fluctuation of the energy estimate of equation (8) is significantly reduced compared to that of equation (7).

Figure 8:
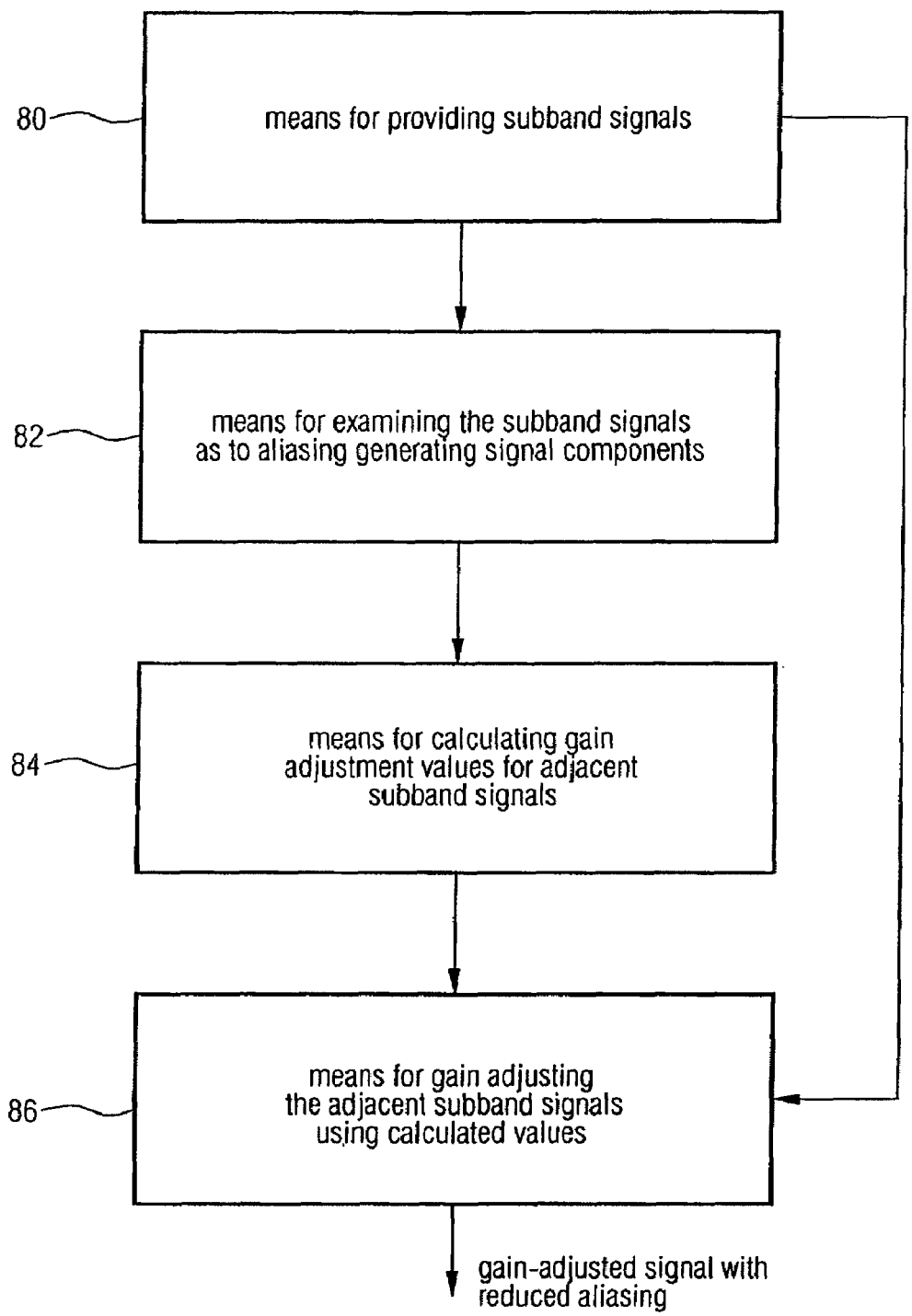
FIG. 8 illustrates a block diagram of the inventive apparatus.

FIG. 8 illustrates an inventive apparatus for spectral envelope adjustment of a signal. The inventive apparatus includes a means 80 for providing a plurality of subband signals. It is to be noted that a subband signal has associated therewith a channel number k indicating a frequency range covered by the subband signal. The subband signal originates from a channel filter having the channel number k in an analysis filterbank. The analysis filterbank has a plurality of channel filters, wherein the channel filter having the channel number k has a certain channel response which is overlapped with a channel response of an adjacent channel filter having a lower channel number k−1. The overlapping takes place in a certain overlapping range. As to the overlapping ranges, reference is made to FIGS. 1, 3, 4, and 7 showing overlapping impulse responses in dashed lines of adjacent channel filters of an analysis filterbank.

The subband signals output by the means 80 from FIG. 8 are input into a means 82 for examining the subband signals as to aliasing generating signal components. In particular, the means 82 is operative to examine the subband signal having associated therewith the channel number k and to examine an adjacent subband signal having associated therewith the channel number k−1. This is to determine whether the subband signal and the adjacent subband signal have aliasing generating signal components in the overlapping range such as a sinusoidal component as illustrated for example in FIG. 1. It is to be noted here that the sinusoidal signal component for example in the subband signal having associated therewith channel number 15 is not positioned in the overlapping range. The same is true for the sinusoidal signal component in the subband signal having associated therewith the channel number 20. Regarding the other sinusoidal components shown in FIG. 1, it becomes clear that those are in overlapping ranges of corresponding adjacent subband signals.

The means 82 for examining is operative to identify two adjacent subband signals, which have an aliasing generating signal component in the overlapping range. The means 82 is coupled to a means 84 for calculating gain adjustment values for adjacent subband signals. In particular, the means 84 is operative to calculate the first gain adjustment value and a second gain adjustment value for the subband signal on the one hand and the adjacent subband signal on the other hand. The calculation is performed in response to a positive result of the means for examining. In particular, the means for calculating is operative to determine the first gain adjustment value and the second gain adjustment value not independent on each other but dependent on each other.

The means 84 outputs a first gain adjustment value and a second gain adjustment value. It is to be noted at this point that, preferably, the first gain adjustment value and the second gain adjustment value are equal to each other in a preferred embodiment. In the case of modifying gain adjustment values, which have been calculated for example in a spectral band replication encoder, the modified gain adjustment values corresponding to the original SBR gain adjustment values are both smaller than the higher value of the original values and higher than the lower value of the original values as will be outlined later on.

The means 84 for calculating gain adjustment values therefore calculates two gain adjustment values for the adjacent subband signals. These gain adjustment values and the subband signals themselves are supplied to a means 86 for gain adjusting the adjacent subband signals using the calculated gain adjustment values. Preferably, the gain adjustment performed by the means 86 is performed by a multiplication of subband samples by the gain adjustment values so that the gain adjustment values are gain adjustment factors. In other words, the gain adjustment of a subband signal having several subband samples is performed by multiplying each subband sample from a subband by the gain adjustment factor, which has been calculated for the respective subband. Therefore, the fine structure of the subband signal is not touched by the gain adjustment. In other words, the relative amplitude values of the subband samples are maintained, while the absolute amplitude values of the subband samples are changed by multiplying these samples by the gain adjustment value associated with the respective subband signal.

At the output of means 86, gain-adjusted subband signals are obtained. When these gain-adjusted subband signals are input into a synthesis filterbank, which is preferably a real-valued synthesis filterbank, the output of the synthesis filterbank, i.e., the synthesized output signal does not show significant aliasing components as has been described above with respect to FIG. 7.

It is to be noted here that a complete cancellation of aliasing components can be obtained, when the gain values of the adjacent subband signals are made equal to each other. Nevertheless, at least a reduction of aliasing components can be obtained when the gain adjustment values for the adjacent subband signals are calculated dependent on each other. This means that an improvement of the aliasing situation is already obtained, when the gain adjustment values are not totally equal to each other but are closer to each other compared to the case, in which no inventive steps have been taken.

Normally, the present invention is used in connection with spectral band replication (SBR) or high frequency reconstruction (HFR), which is described in detail in WO 98/57436 A2.

As it is known in the art, spectral envelope replication or high frequency reconstruction includes certain steps at the encoder-side as well as certain steps at the decoder-side.

In the encoder, an original signal having a full bandwidth is encoded by a source encoder. The source-encoder produces an output signal, i.e., an encoded version of the original signal, in which one or more frequency bands that were included in the original signal are not included any more in the encoded version of the original signal. Normally, the encoded version of the original signal only includes a low band of the original bandwidth. The high band of the original bandwidth of the original signal is not included in the encoded version of the original signal. At the encoder-side, there is, in addition, a spectral envelope analyser for analysing the spectral envelope of the original signal in the bands, which are missing in the encoded version of the original signal. This missing band(s) is, for example, the high band. The spectral envelope analyser is operative to produce a coarse envelope representation of the band, which is missing in the encoded version of the original signal. This coarse spectral envelope representation can be generated in several ways. One way is to pass the respective frequency portion of the original signal through an analysis filterbank so that respective subband signals for respective channels in the corresponding frequency range are obtained and to calculate the energy of each subband so that these energy values are the coarse spectral envelope representation.

Another possibility is to conduct a Fourier analysis of the missing band and to calculate the energy of the missing frequency band by calculating an average energy of the spectral coefficients in a group such as a critical band, when audio signals are considered, using a grouping in accordance with the well-known Bark scale.

In this case, the coarse spectral envelope representation consists of certain reference energy values, wherein one reference energy value is associated with a certain frequency band. The SBR encoder now multiplexes this coarse spectral envelope representation with the encoded version of the original signal to form an output signal, which is transmitted to a receiver or an SBR-ready decoder.

The SBR-ready decoder is, as it is known in the art, operative to regenerate the missing frequency band by using a certain or all frequency bands obtained by decoding the encoded version of the original signal to obtain a decoded version of the original signal. Naturally, the decoded version of the original signal also does not include the missing band. This missing band is now reconstructed using the bands included in the original signal by spectral band replication. In particular, one or several bands in the decoded version of the original signal are selected and copied up to bands, which have to be reconstructed. Then, the fine structure of the copied up subband signals or frequency/spectral coefficients are adjusted using gain adjustment values, which are calculated using the actual energy of the subband signal, which has been copied up on the one hand, and using the reference energy which is extracted from the coarse spectral envelope representation, which has been transmitted from the encoder to the decoder. Normally, the gain adjustment factor is calculated by determining the quotient between the reference energy and the actual energy and by taking the square root of this value.

Figure 2:
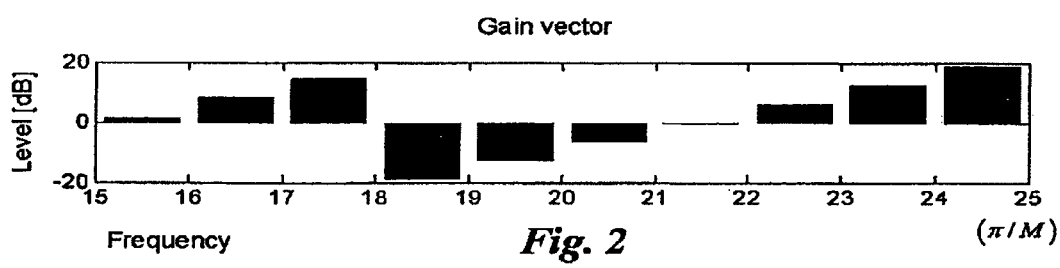
FIG. 2 illustrates a gain vector containing the gain values to be applied to the subband channels 15-24 of the original signal.

This is the situation, which has been described before with respect to FIG. 2. In particular, FIG. 2 shows such gain adjustment values which have, for example, been determined by a gain adjustment block in a high frequency reconstruction or SBR-ready decoder.

The inventive device illustrated in FIG. 8 can be used for completely replacing a normal SBR-gain adjustment device or can be used for enhancing a prior art gain-adjustment device. In the first possibility, the gain-adjustment values are determined for adjacent subband signals dependent on each other in case the adjacent subband signals have an aliasing problem. This means that, in the overlapping filter responses of the filters from which the adjacent subband signals originate, there were aliasing-generating signal components such as a tonal signal component as has been discussed in connection with FIG. 1. In this case, the gain adjustment values are calculated by means of the reference energies transmitted from the SBR-ready encoder and by means of an estimation for the energy of the copied-up subband signals, and in response to the means for examining the subband signals as to aliasing generating signal components.

Figure 6:
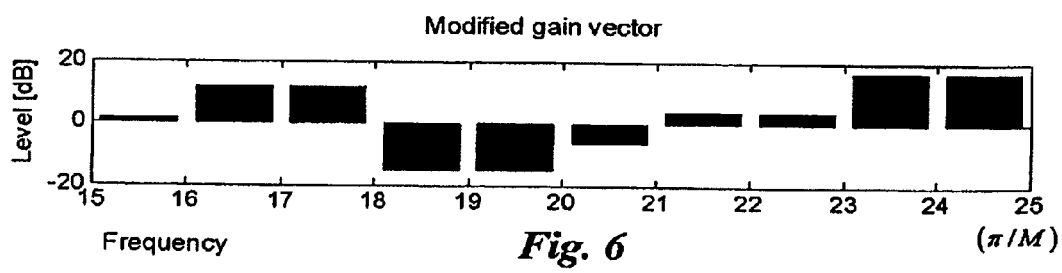
FIG. 6 illustrates the preferred channel grouping according to the present invention.

In the other case, in which the inventive device is used for enhancing the operability of an existing SBR-ready decoder, the means for calculating gain adjustment values for adjacent subband signals can be implemented such that it retrieves the gain adjustment values of two adjacent subband signals, which have an aliasing problem. Since a typical SBR-ready encoder does not pay any attention to aliasing problems, these gain adjustment values for these two adjacent subband signals are independent on each other. The inventive means for calculating the gain adjustment values is operative to derive calculated gain adjustment values for the adjacent subband signals based on the two retrieved "original" gain adjustment values. This can be done in several ways. The first way is to make the second gain adjustment value equal to the first gain adjustment value. The other possibility is to make the first gain adjustment value equal to the second gain adjustment value. The third possibility is to calculate the average of both original gain adjustment values and to use this average as the first calculated gain adjustment value and the second calculated envelope adjustment value. Another opportunity would be to select different or equal first and second calculated gain adjustment values, which are both lower than the higher original gain adjustment value and which are both higher than the lower gain adjustment value of the two original gain adjustment values. When FIG. 2 and FIG. 6 are compared, it becomes clear that the first and the second gain adjustment values for two adjacent subbands, which have been calculated dependent on each other, are both higher than the original lower value and are both smaller than the original higher value.

In accordance with another embodiment of the present invention, in which the SBR-ready encoder already performs the features of providing subband signals (block 80 of FIG. 8), examining the subband signals as to aliasing generating signal components (block 82 of FIG. 8) and calculating gain adjustment values for adjacent subband signals (block 84) are performed in a SBR-ready encoder, which does not do any gain adjusting operations. In this case, the means for calculating, illustrated by reference sign 84 in FIG. 8, is connected to a means for outputting the first and the second calculated gain adjustment value for transmittal to a decoder.

In this case, the decoder will receive an already "aliasing-reduced" coarse spectral envelope representation together with preferably an indication that the aliasing-reducing grouping of adjacent subband signals has already been conducted. Then, no modifications to a normal SBR-decoder are necessary, since the gain adjustment values are already in good shape so that the synthesized signal will show no aliasing distortion.

In the following, certain implementations of the means 84 for providing subband signals are described. In case the present invention is implemented in a novel encoder, the means for providing a plurality of subband signals is the analyser for analysing the missing frequency band, i.e., the frequency band that is not included in the encoded version of the original signal.

In case the present invention is implemented in a novel decoder, the means for providing a plurality of subband signals can be an analysis filterbank for analysing the decoded version of the original signal combined with an SBR device for transposing the low band subband signals to high band subband channels. In case, however, the encoded version of the original signal includes quantized and potentially entropy-encoded subband signals themselves, the means for providing does not include an analysis filterbank. In this case, the means for providing is operative to extract entropy-decoded and requantized subband signals from the transmitted signal input to the decoder. The means for providing is further operative to transpose such low band extracted subband signals in accordance with any of the known transposition rules to the high band as it is known in the art of spectral band replication or high frequency reconstruction.

Figure 9:
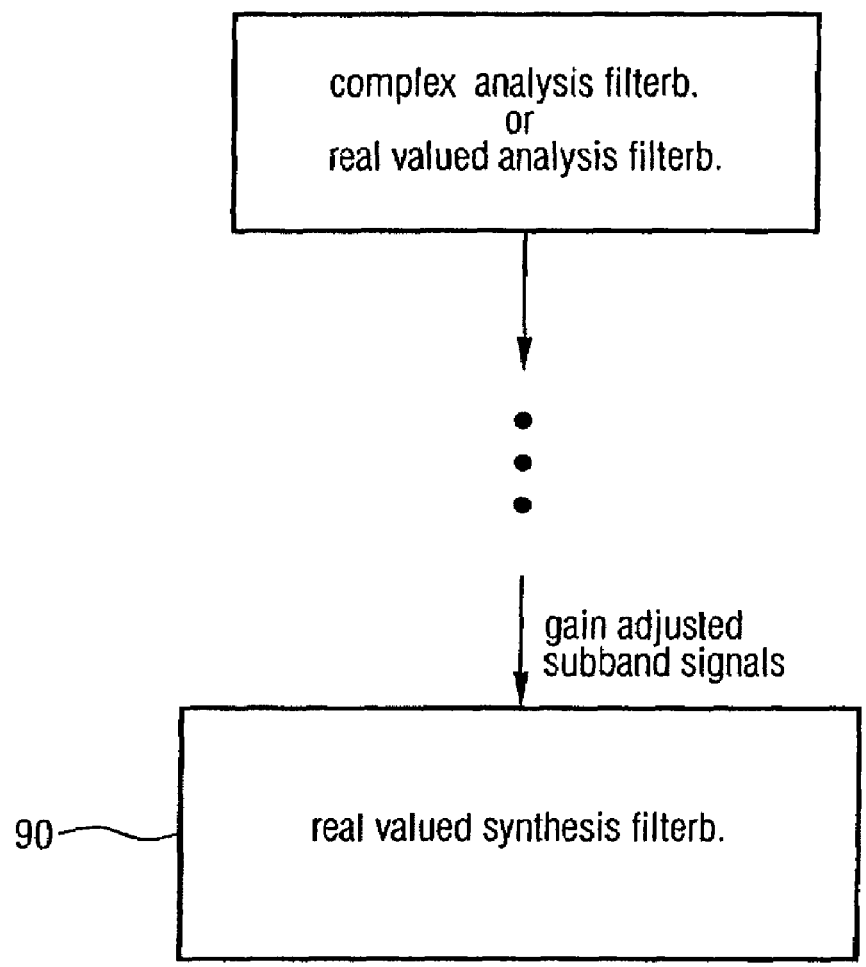
FIG. 9 illustrates combinations of analysis and synthesis filterbanks for which the invention can be advantageously used.

FIG. 9 shows the cooperation of the analysis filterbank (which can be situated in the encoder or the decoder) and a synthesis filterbank 90, which is situated in an SBR-decoder. The synthesis filterbank 90 positioned in the decoder is operative to receive the gain-adjusted subband signals to synthesize the high band signal, which is then, after synthesis, combined to the decoded version of the original signal to obtain a fullband decoded signal. Alternatively, the real valued synthesis filterbank can cover the whole original frequency band so that the low band channels of the synthesis filterbank 90 are supplied with the subband signals representing the decoded version of the original signal, while the high band filter channels are supplied with the gain adjusted subband signals output by means 84 from FIG. 8.

As has been outlined earlier, the inventive calculation of gain adjustment values in dependence from each other allows to combine a complex analysis filterbank and a real-valued synthesis filterbank or to combine a real-valued analysis filterbank and a real-valued synthesis filterbank in particular for low cost decoder applications.

Figure 10:
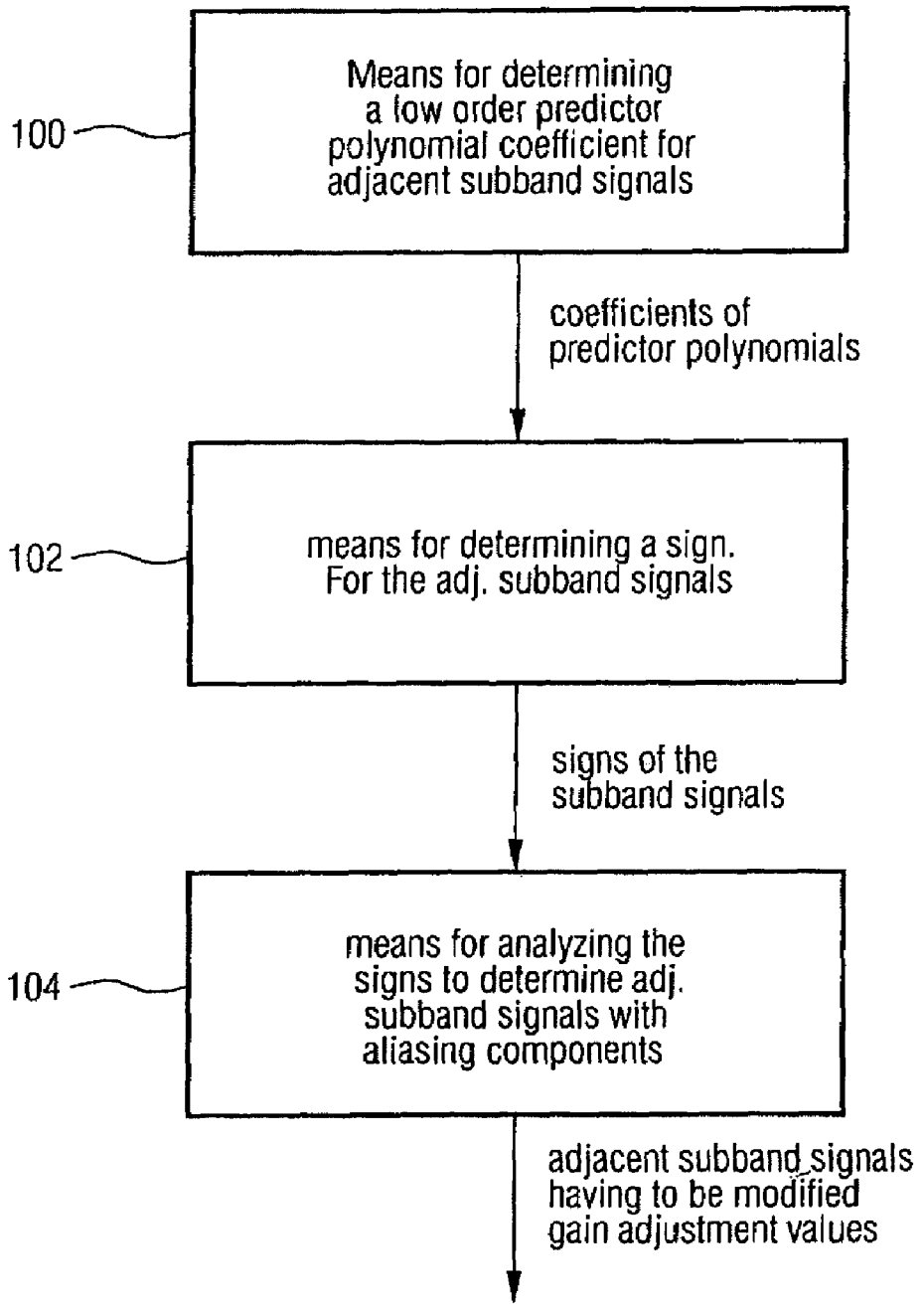
FIG. 10 illustrates a block diagram of the means for examining from FIG. 8 in accordance with the preferred embodiment.

FIG. 10 illustrates a preferred embodiment of the means 82 for examining the subband signals. As has been outlined before with respect to FIG. 5, the means 82 for examining from FIG. 8 includes a means 100 for determining a low order predictor polynomial coefficient for a subband signal and an adjacent subband signal so that coefficients of predictor polynomials are obtained. Preferably, as has been outlined with respect to equation (1), the first predictor polynomial coefficient of a second order prediction polynomial as defined in the equation (1) is calculated. The means 100 is coupled to means 102 for determining a sign of a coefficient for the adjacent subband signals. In accordance with the preferred embodiment of the present invention, the means 102 for determining is operative to calculate the equation (2) so that a subband signal and the adjacent subband signal are obtained. The sign for a subband signal obtained by means 102 depends, on the one hand, on the sign of the predictor polynomial coefficient and, on the other hand, of the channel number or subband number k. The means 102 in FIG. 10 is coupled to a means 104 for analysing the signs to determine adjacent subband signals having aliasing-problematic components.

In particular, in accordance with the preferred embodiment of the present invention, the means 104 is operative to determine subband signals as subband signals having aliasing-generating signal components, in case the subband signal having the lower channel number has a positive sign and the subband signal having the higher channel number has a negative sign. When FIG. 5 is considered, it becomes clear that this situation arises for subband signals 16 and 17 so that the subband signals 16 and 17 are determined to be adjacent subband signals having coupled gain adjustment values. The same is true for subband signals 18 and 19 or subband signals 21 and 22 or subband signals 23 and 24.

It is to be noted here that, alternatively, also another prediction polynomial, i.e., a prediction polynomial of third, forth or fifth order can be used, and that also another polynomial coefficient can be used for determining the sign such as the second, third or forth order prediction polynomial coefficient. The procedure shown with respect to equations 1 and 2 is, however, preferred since it involves a low calculation overhead.

Figure 11:
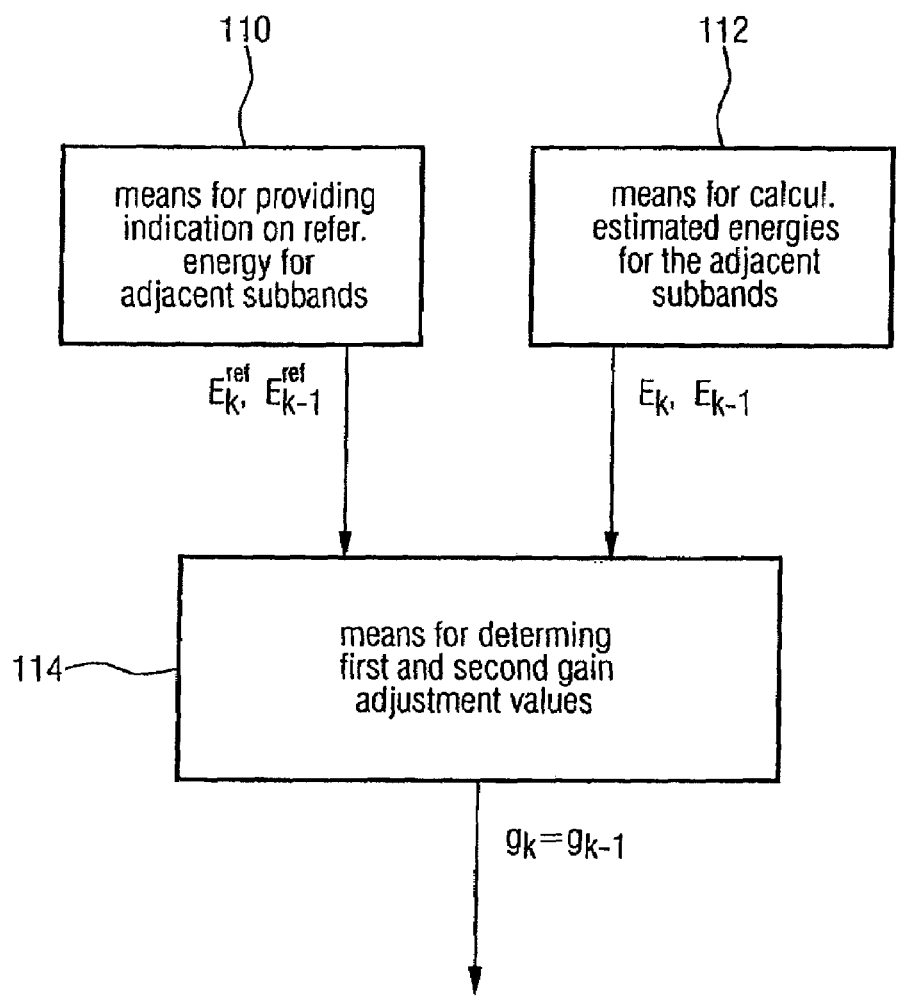
FIG. 11 illustrates a block diagram of the means for gain adjusting from FIG. 8 in accordance with the preferred embodiment of the present invention.

FIG. 11 shows a preferred implementation of the means for calculating gain adjustment values for adjacent subband signals in accordance with the preferred embodiment of the present invention. In particular, the means 84 from FIG. 8 includes a means 110 for providing an indication of a reference energy for adjacent subbands, a means 112 for calculating estimated energies for the adjacent subbands and a means 114 for determining first and second gain adjustment values. Preferably, the first gain adjustment value $g_k$ and the second gain adjustment value $g_{k-1}$ are equal. Preferably, means 114 is operative to perform equation (3) as shown above. It is to be noted here that normally, the indication on the reference energy for adjacent subbands is obtained from an encoded signal output by a normal SBR encoder. In particular, the reference energies constitute the coarse spectral envelope information as generated by a normal SBR-ready encoder.

Depending on the circumstances, the inventive method of spectral envelope adjustment can be implemented in hardware or in software. The implementation can take place on a digital storage medium such as a disk or a CD having electronically readable control signals, which can cooperate with a programmable computer system so that the inventive method is carried out. Generally, the present invention, therefore, is a computer program product having a program code stored on a machine-readable carrier, for performing the inventive method, when the computer-program product runs on a computer. In other words, the invention is, therefore, also a computer program having a program code for performing the inventive method, when the computer program runs on a computer.

The invention claimed is:

1. Apparatus for calculating gain adjustment values for gain adjusting a plurality of audio subband signals generated by filtering an audio signal using an analysis filterbank, the analysis filterbank having subband filters, adjacent subband filters of the filterbank having transition bands overlapping in an overlapping range, comprising:

an examiner for examining an audio subband signal originating from a subband filter and an adjacent audio subband signal originating from an adjacent subband filter, to determine whether the audio subband signal and the adjacent audio subband signal have aliasing generating signal components in the overlapping range to obtain grouped audio subband signals in response to a result of the examination indicating that the audio subband signal and the adjacent audio subband signal have aliasing generating signal components in the overlapping range;

a calculator for calculating a first gain adjustment value and a second gain adjustment value for the grouped adjacent audio subband signals, wherein the calculator is operative to determine an indication of a reference energy for the grouped audio subband signals and an energy estimate for an energy in the grouped adjacent audio subband signals, and to calculate the gain adjustment values for the grouped audio subband signals based on the indication of the reference energy and the energy estimate.

2. Apparatus in accordance with claim 1, further comprising a provider for providing a first reference spectral envelope value for the audio subband signal and a second reference spectral envelope value for the adjacent audio subband signal, in which the calculator is operative to determine, for grouped audio subband signals, a first energy measure indicating a signal energy of the audio subband signal and a second energy measure indicating a signal energy of the adjacent audio subband signal, and in which the calculator is further operative to calculate the indication of the reference energy as a linear combination of the first reference spectral envelope value and the second reference spectral envelope value and to calculate the energy estimate for an energy in the grouped adjacent audio subband signals as a linear combination of the first energy measure and the second energy measure.

3. Apparatus in accordance with claim 1, which the calculator is operative to calculate the first and the second gain adjustment values such that they differ by less than a predetermined threshold or are equal to each other.

4. Apparatus in accordance with claim 3, in which the predetermined threshold is lower than or equal to 6 dB.

5. Apparatus in accordance with claim 1, further comprising means for providing an unmodified first gain adjustment value for the audio subband signal and an unmodified second gain adjustment value for the adjacent audio subband signal, and in which the calculator is operative to calculate the first and the second gain adjustment values so that both are larger than or equal to a lower value of the first and the second unmodified gain adjustment values and smaller or equal to a higher value of the first and the second unmodified gain adjustment values.

6. Apparatus in accordance with claim 5, in which the unmodified first gain adjustment value and the unmodified second gain adjustment value are indicative for a spectral envelope of an original signal in a frequency band, wherein the frequency band is to be reconstructed by a spectral band replication.

7. Apparatus in accordance with claim 1, in which the calculator is operative to calculate the first gain adjustment value and the second gain adjustment value based on an average energy of the audio subband signal and the adjacent audio subband signal.

8. Apparatus in accordance with claim 1,
in which the calculator is operative to calculate the first and the second gain adjustment factors according to the following equation:

$$g_k(m) = g_{k-1}(m) = \sqrt{\frac{E_k^{ref}(m) + E_{k-1}^{ref}(m)}{E_k(m) + E_{k-1}(m)}},$$

wherein $g_{k-1}(m)$ is the gain adjustment factor for a first audio subband signal of grouped audio subband signals, wherein $g_k(m)$ is the gain adjustment factor for a second audio subband signal of the grouped audio subband signals, wherein $E_{k-1}^{ref}(m)$ is the reference energy for the first audio subband signal, wherein $E_k^{ref}(m)$ is the reference energy for the second audio subband signal, wherein $E_{k-1}(m)$ is the energy estimate of the first audio subband signal, wherein $E_k(m)$ is the energy estimate of the second audio subband signal, and wherein m indicates a point in time.

9. Apparatus in accordance with claim 1, in which an energy estimate for an audio subband signal is calculated by summing of squared audio subband samples of the audio subband signal.

10. Apparatus in accordance with claim 1, in which the examiner is operative to calculate signs of audio subband signals based on coefficients of prediction polynomials for the audio subband signal and the adjacent audio subband signal, and to indicate the result that the audio subband signal and the adjacent audio subband signal have aliasing generating signal components in the overlapping range, when the signs have a predetermined relationship to each other.

11. Apparatus in accordance with claim 10, in which the examiner is operative to apply an auto-correlation method or a co-variance method.

12. Apparatus in accordance with claim 10, in which the prediction polynomial is a low order polynomial having a first order coefficient, wherein the order of the low order polynomial is smaller than 4 and in which the examiner is operative to use the first order coefficient for calculating the signs of the audio subband signals.

13. Apparatus in accordance with claim 10, in which the examiner is operative to calculate the sign for an audio subband signal based on the following equation:

$$\text{sign}(k) = \begin{cases} (-1)^k & \text{if } \alpha_1 < 0 \\ (-1)^{k+1} & \text{if } \alpha_1 \geq 0 \end{cases}, 0 < k < M, \quad (2)$$

wherein k is the channel number, and $\alpha_1$ is the first-order coefficient.

14. Apparatus in accordance with claim 10, in which the predetermined relationship is defined such that the audio subband signal having associated therewith the channel number k has a first sign and the adjacent audio subband signal having associated therewith the channel number k−1 has a second sign, which is opposite to the first sign.

15. Apparatus in accordance with claim 14, in which the first sign is negative, and the second sign is positive.

16. Apparatus in accordance with claim 1, in which the examiner is operative to perform a tonal analysis for the audio subband signal and the adjacent audio subband signal for determining a tonal component having a tonality measure above a tonality threshold.

17. Apparatus in accordance with claim 16, in which the examiner is operative to determine, whether the tonal component is in the overlapping range of channel k and channel k−1.

18. Apparatus in accordance with claim 1, further comprising a synthesis filterbank for filtering the gain adjusted audio subband signals to obtain a synthesized output signal.

19. Apparatus in accordance with claim 1, in which the analysis filterbank is a real valued filterbank, and in which the synthesis filterbank is a real valued filterbank.

20. Apparatus in accordance with claim 1, in which the analysis filterbank is a complex-valued filterbank, and in which the synthesis filterbank is a real-valued filterbank.

21. Method of calculating gain adjustment values for gain adjusting a plurality of audio subband signals generated by filtering a signal using an analysis filterbank, the filterbank having subband filters, adjacent subband filters of the filterbank having transition bands overlapping in an overlapping range, comprising:

examining an audio subband signal originating from a subband filter and an adjacent audio subband signal originating from an adjacent subband filter, to determine whether the audio subband signal and the adjacent audio subband signal have aliasing generating signal components in the overlapping range to obtain grouped audio subband signals in response to a result of the examination indicating that the audio subband signal and the adjacent audio subband signal have aliasing generating signal components in the overlapping range;

calculating a first gain adjustment value and a second gain adjustment value for the grouped adjacent audio subband signals,
by determining an indication of a reference energy for the grouped audio subband signals, an energy estimate for an energy in the grouped adjacent audio subband signals, and
by calculating the gain adjustment values for the grouped audio subband signals based on the indication of the reference energy and the energy estimate.

22. Digital storage medium having stored thereon a computer program having a program code for accessing an energy of a signal in accordance with claim 21, when the computer program runs on a computer.

* * * * *